US008828833B1

(12) United States Patent
Blatchford et al.

(10) Patent No.: US 8,828,833 B1
(45) Date of Patent: Sep. 9, 2014

(54) SYSTEM FOR CONTROLLING SIGE-TO-GATE SPACING

(71) Applicant: Texas Instruments Incorporated, Dallas, TX (US)

(72) Inventors: James Walter Blatchford, Saratoga Springs, NY (US); Chet Vernon Lenox, Venus, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/031,738

(22) Filed: Sep. 19, 2013

(51) Int. Cl.
H01L 21/336 (2006.01)
H01L 21/66 (2006.01)
H01L 21/306 (2006.01)

(52) U.S. Cl.
CPC .......... H01L 22/26 (2013.01); H01L 21/30604 (2013.01)
USPC ....................... 438/300; 438/589; 257/E21.42

(58) Field of Classification Search
USPC ......................................... 257/E21.4, E21.42
See application file for complete search history.

(56) References Cited

U.S. PATENT DOCUMENTS

2007/0287244 A1 12/2007 Shen et al.
2012/0064686 A1 3/2012 Farber et al.

Primary Examiner — Cheung Lee
(74) Attorney, Agent, or Firm — Jacqueline J. Garner; Frederick J. Telecky, Jr.

(57) ABSTRACT

A method of forming PMOS transistors. A SiGe cavity formation process includes cavity etching a structure including a gate stack having a gate electrode on a gate dielectric on a substrate, a sidewall spacer, and a hardmask layer on the gate electrode. The cavity etching includes (i) a first anisotropic dry etch for etching through the hardmask layer lateral to the gate stack and beginning a recessed cavity in the substrate, (ii) a dry lateral etch, and (iii) a second anisotropic dry etch. A wet crystallographic etch completes formation of the recessed cavity. A customized time is calculated for a selected dry etch step from the plurality of dry etch steps based on in-process SiGe cavity data for a measured cavity parameter for a SiGe cavity formation process. The customized time for the selected dry etch is used to cavity etch at least one substrate in a lot or run.

10 Claims, 2 Drawing Sheets

US 8,828,833 B1

SYSTEM FOR CONTROLLING SIGE-TO-GATE SPACING

FIELD

Disclosed embodiments relate to methods and systems for fabricating complementary metal-oxide-semiconductor (CMOS) devices including P-channel (PMOS) transistors having raised embedded silicon-germanium (SiGe) sources and drains.

BACKGROUND

Techniques to embed SiGe source/drain regions have been used for CMOS devices to increase compressive stress in the channel region of PMOS devices to improve device performance by raising hole mobility. In such process flows, following gate stack and source/drain formation, a cavity is formed in the source/drain regions of the PMOS device. Cavity formation is generally accomplished by a multi-step dry etch process, followed by a wet etch process.

The first dry etch step is a first anisotropic dry etch used to etch through a deposited hardmask layer (e.g., silicon nitride) to begin etching of a cavity in the substrate (e.g., silicon), followed by an isotropic dry lateral etch (dry lateral etch) that expands the cavity including laterally toward the MOS transistor channel, followed by a second anisotropic dry etch to define the bottom wall of the cavity.

The multi-step dry etch is generally followed by a wet crystallographic etch which forms a "diamond-shaped" cavity. The wet etchant for the crystallographic etch has crystal orientation selectivity to the substrate material, such as an etchant comprising tetramethyl ammonium hydroxide (TMAH), which is used to etch the substrate beginning with the U-shaped recesses provided by the multi-step dry etch processing. During the wet crystallographic etching process, the etch rate of the <111> crystal orientation is less than that of other crystal orientations such as <100>. As a result, the U-shaped recesses become diamond-shaped recesses.

FIG. 1A is a depiction showing an in-process PMOS transistor 150 immediately after completing multi-step dry cavity etch processing showing the resulting SiGe-to-gate edge distance (S2G) that would result as defined by the then-present cavity dimensions. The PMOS transistor 150 is shown having a gate stack including a metal gate electrode 115 and a Hi-K dielectric 120 on a substrate 125 such as silicon, with a sidewall spacer 130 on the walls of the gate stack and a hard mask layer (e.g., silicon nitride) 135 on the gate electrode 115. Other parameters shown in FIG. 1A include the spacer width (SPW) which extends to the outer edge of the sidewall spacer 130. Due to slight undercutting during dry cavity etching, S2G is shown being somewhat less than SPW.

FIG. 1B shows a depiction of an in-process PMOS transistor 150' after the wet crystallographic cavity etch forms diamond-shaped recesses. The S2G is shown to decrease compared to the S2G shown in FIG. 1A. The depth to tip of the diamond-shaped recesses is shown as $d_1$, and the depth of the bottom wall is shown as $d_2$.

Following the wet crystallographic etch, SiGe is grown epitaxially with in situ boron doping in the diamond-shaped recesses to form the PMOS embedded SiGe source/drain regions. The embedded SiGe regions should be spaced closely enough to the outer edge of the PMOS transistor channel so that they impart a high amount of compressive stress to the channel. However, the SiGe regions should not be too close to the outer edge of the PMOS transistor channel so that dopant diffusion from the in-situ doping in the SiGe overruns the PMOS channel and changes the channel doping, and as a result alters the PMOS threshold voltage (Vt).

As a result, the electrical parameters for the PMOS transistor having embedded SiGe sources and drains, especially the PMOS Vt, are known to have a strong dependence on S2G. Accordingly, good control of S2G is needed to help control the Vt for PMOS transistors.

The value of S2G can depend on a plurality of factors that are each generally not well controlled wafer-to-wafer or run-to-run (e.g., lot-to lot), including the incoming silicon oxide thickness from various oxidation steps, the amount of spacer (e.g., a silicon nitride spacer) remaining prior to SiGe processing, the thickness of the spacer material used to define the amount of S2G, and the etch rates of the subsequent SiGe dry etch steps and wet etch step used to form the cavity before SiGe epitaxial growth. Good S2G control is therefore difficult to achieve, both wafer-to-wafer and run-to-run.

SUMMARY

Disclosed embodiments describe methods and systems for controlling the SiGe-to-gate distance (S2G) for p-channel metal-oxide-semiconductor (PMOS) transistors during a CMOS integrated circuit (IC) fabrication process. A single SiGe process variable is intentionally changed run-to-run or wafer-to-wafer using a feedback or feedforward control methodology to improve S2G control, rather than conventionally attempting to tightly control the plurality of process variables noted above that each impact S2G. Advantages of disclosed embodiments include improved S2G control, leading to better control of PMOS transistor parametrics, including the PMOS threshold voltage (Vt).

BRIEF DESCRIPTION OF THE DRAWINGS

Reference will now be made to the accompanying drawings, which are not necessarily drawn to scale, wherein.

DETAILED DESCRIPTION

Figure 1B:
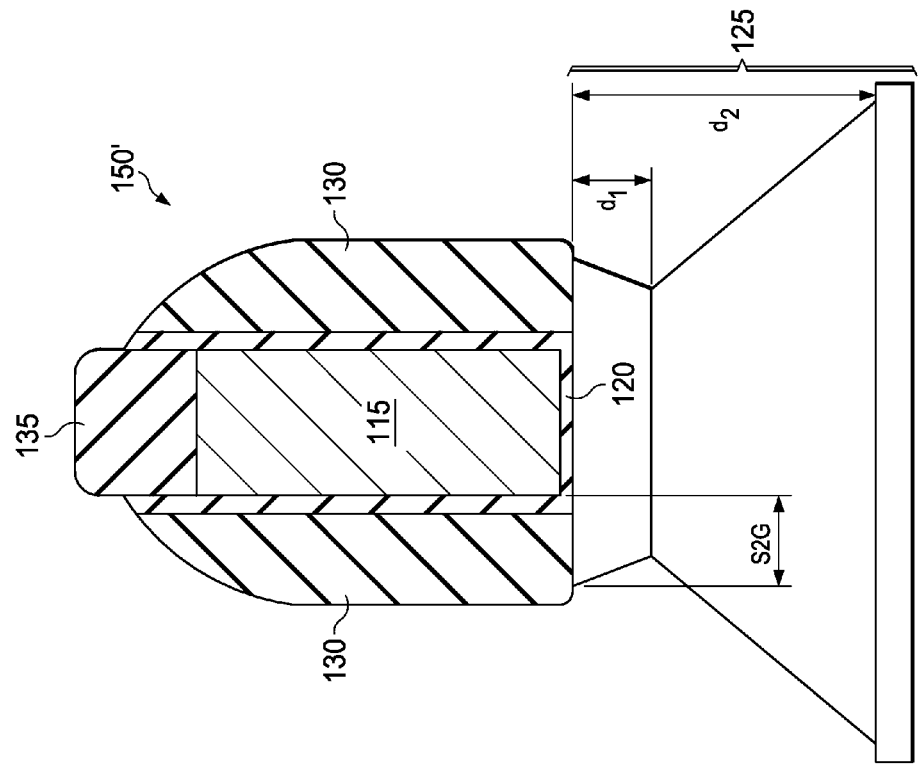
FIG. 1B shows a depiction of an in-process PMOS transistor having diamond-shaped recesses after the wet crystallographic cavity etch.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments use advanced process control (APC) to adjust the S2G distance run-to-run (e.g., lot-to-lot) and/or substrate-to-substrate (e.g., wafer-to-wafer) to compensate for variations in a plurality of parameters incoming substrate conditions (e.g., layers on the substrate) and/or differences in etch rates for SiGe cavity formation etching. The S2G is controlled by adjusting a single parameter, being the time for one of the dry cavity etches hereafter referred to as the "selected" dry cavity etch. Disclosed tuning of the time for the selected dry cavity etch, such as the time for the dry lateral etch, can be realized using either a feedforward control or feedback control method, or a combination of both feedforward and feedback control.

Figure 2:
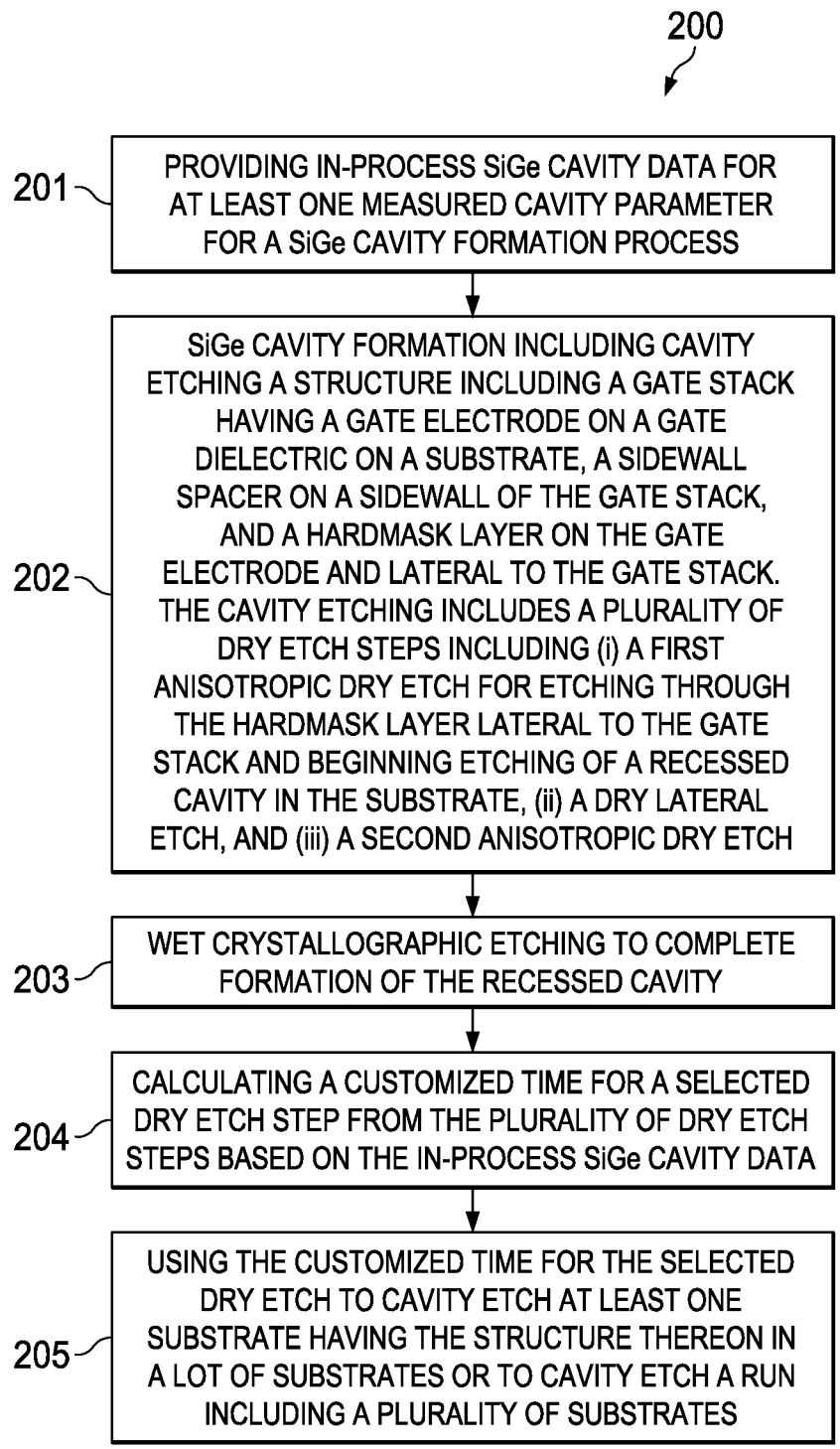
FIG. 2 is a flow chart that shows steps in an example method for forming raised embedded SiGe sources and drains for PMOS transistors having a controlled S2G, according to an example embodiment.

FIG. 2 is a flow chart that shows steps in an example method 200 for forming raised embedded SiGe sources and drains for PMOS transistors having a controlled S2G, according to an example embodiment. Step 201 comprises providing in-process SiGe cavity data for at least one measured cavity parameter for a SiGe cavity formation process. Step 202 comprises a SiGe cavity formation process including cavity etching a structure including a gate stack having a gate electrode on a gate dielectric on a substrate, a sidewall spacer on a sidewall of the gate stack, and a hardmask layer on the gate electrode and lateral to the gate stack. The cavity etching includes a plurality of dry etch steps including (i) a first anisotropic dry etch for etching through the hardmask layer lateral to the gate stack and beginning etching of a recessed cavity in the substrate, (ii) a dry lateral etch, and (iii) a second anisotropic dry etch.

Step 203 comprises a wet crystallographic etch to complete formation of the recessed cavity. Step 204 comprises calculating a customized time for a selected dry etch step from the plurality of dry etch steps based on the in-process SiGe cavity data. Step 205 comprises using the customized time for the selected dry etch to cavity etch at least one substrate (e.g., a wafer) having the structure thereon in a lot of substrates or to cavity etch a run including a plurality of substrates.

One embodiment comprise feedback control. For feedback control, for example, a "send-ahead" wafer can be processed through the SiGe cavity formation process, and a measurement of S2G can then be taken by a suitable method, such as by scatterometry. The etch time for the selected dry lateral etch for the remaining wafers in the lot can be subsequently adjusted based on the S2G distance measured on the send-ahead wafer to provide S2G targeting for the wafers in the lot. For example, if the S2G distance measured on the send-ahead wafer after growing the epitaxial SiGe regions is below a predetermined minimum S2G limit, the etch time for the selected dry lateral etch for the remaining wafers in the lot can be reduced relative to the time used for the dry lateral etch for the send-ahead wafer.

Alternatively, in another embodiment, feedback control is used for determining the time for the selected dry lateral etch accomplished by using control system theory, where historical S2G measurements from previous lots all from the same etcher can be used to determine the lateral etch time for a given lot based on a predefined calculation and correction algorithm. In this embodiment, each dry etch tool being used has an assigned offset variable. This offset variable is used, along with any incoming feedforward parameters, to provide the appropriate dry etch time. Then, using the resulting S2G measurement, the offset variable is adjusted for the particular etcher used.

In another embodiment, feedforward correction is used for determining the time for the selected dry lateral etch which can be implemented using measured process variables on each wafer to be processed known to contribute to S2G variation (e.g., spacer thickness, hardmask thickness, and blanket etch rate information), and calculating a time for the selected dry lateral etch based on a combination of these measured variables using an empirical model calibrated to empirical measured process variable data. It is noted that the feedforward methodology used to implement this method is for substrate-to-substrate (e.g., wafer-to-wafer) adjustment.

In another embodiment, other cavity parameters besides S2G for SiGe formation, such as the depth of the tip of the diamond shape ($d_1$ in FIG. 1B) and the depth of the bottom wall ($d_2$ in FIG. 1B) can be independently adjusted by modifying times for the other anisotropic dry cavity etches.

Figure 1A:
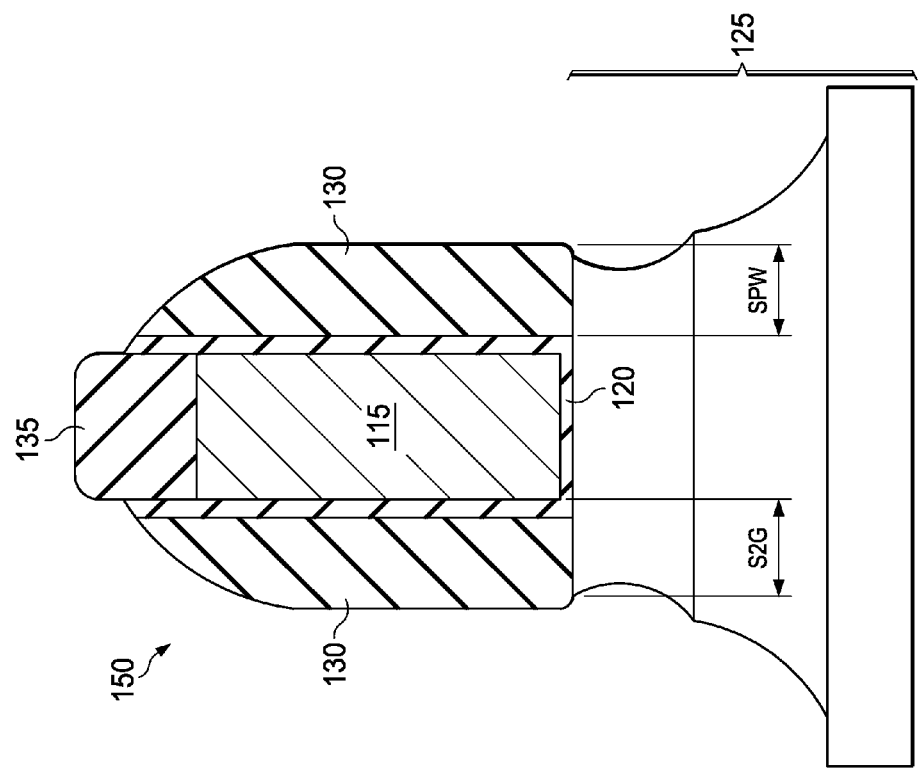
FIG. 1A is a depiction showing an in-process PMOS transistor immediately after completing the multi-step dry cavity etch processing showing the S2G that would result as defined by the then-present cavity dimensions.

Disclosed embodiments are applicable to both polysilicon and replacement-metal gate PMOS transistors, since SiGe undercut etch occurs while replacement-gate transistors are still defined by "dummy" polysilicon gates. Thus, despite FIG. 1A and FIG. 1B showing replacement metal gate PMOS transistors, disclosed embodiments are applicable to polysilicon gate PMOS transistors as well.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming a p-channel metal-oxide-semiconductor (PMOS) transistor, comprising:
providing in-process silicon germanium (SiGe) cavity data for at least one measured cavity parameter for a SiGe cavity formation process, said SiGe cavity formation process including cavity etching a structure including a gate stack having a gate electrode on a gate dielectric on a substrate, a sidewall spacer on a sidewall of said gate stack, and a hardmask layer on said gate electrode and lateral to said gate stack, said cavity etching including:
a plurality of dry etch steps including (i) a first anisotropic dry etch for etching through said hardmask layer lateral to said gate stack and beginning etching of a recessed cavity in said substrate, (ii) a dry lateral etch, and (iii) a second anisotropic dry etch, and
a wet crystallographic etch to complete formation of said recessed cavity;
calculating a customized time for a selected dry etch step from said plurality of dry etch steps based on said in-process SiGe cavity data, and
using said customized time for said selected dry etch step to cavity etch at least one substrate having said structure thereon in a lot of substrates or to cavity etch a run including a plurality of said substrates.

2. The method of claim 1, wherein said cavity parameter includes SiGe-to-gate distance (S2G) data.

3. The method of claim 1, wherein said selected dry etch is said first anisotropic dry etch.

4. The method of claim 1, wherein said selected dry etch is said dry lateral etch.

5. The method of claim 4, further comprising generating said in-process SiGe cavity data, wherein said generating comprises feedback control using a send-ahead substrate from said lot of substrates processed through said SiGe cavity formation process, wherein said SiGe cavity data includes SiGe-to-gate distance (S2G) data, and wherein said customized time for said selected dry lateral etch for remaining substrates in said lot of substrates are adjusted based on said S2G distance data measured on said send-ahead substrate.

6. The method of claim 4, wherein said customized time for said dry lateral etch is calculated using control system theory, wherein said SiGe cavity data includes SiGe-to-gate distance (S2G) data from previous lots, and wherein said S2G distance data is used to determine said customized time for said customized time for said lot of substrates based on a predefined calculation and correction algorithm.

7. The method of claim 4, wherein feedforward correction is used to determine said customized time for said selected dry lateral etch by using a plurality of measured process variables which contribute to SiGe-to-gate distance variation and calculating said customized time based on a combination of said plurality of measured process variables from a process model generated from empirical data.

8. The method of claim 1, wherein said in-process SiGe cavity data comprises at least one of a depth of a tip of a diamond shape of said recessed cavity and a depth of a bottom wall of said recessed cavity, wherein said depth of said tip and said depth of said bottom wall are independently adjusted by modifying times for at least one of said first anisotropic dry etch and said second anisotropic dry etch.

9. A method of forming a p-channel metal-oxide-semiconductor (PMOS) transistor, comprising:
provinding in-process silicon germanium (SiGe) cavity data for at least one measured cavity parameter for a SiGe cavity formation process, said SiGe cavity formation process including cavity etching a structure including a gate stack having a gate electrode on a gate dielectric on a substrate, a sidewall spacer on a sidewall of said gate stack, and a hardmask layer on said gate electrode and lateral to said gate stack, said cavity etching including:
a plurality of dry etch steps including (i) a first anisotropic dry etch for etching through said hardmask layer lateral to said gate stack and beginning etching of a recessed cavity in said substrate, (ii) a dry lateral etch, and (iii) a second anisotropic dry etch, and
a wet crystallographic etch to complete formation of said recessed cavity;
calculating a customized time for a selected dry etch step from said plurality of dry etch steps based on said in-process SiGe cavity data, and
using said customized time for said selected dry etch step to cavity etch at least one substrate having said structure thereon in a lot of substrates or to cavity etch a run including a plurality of said substrates,
wherein said cavity parameter includes SiGe-to-gate distance (S2G) data, and
wherein said selected dry etch step is said first anisotropic dry etch.

10. The method of claim 9, further comprising generating said in-process SiGe cavity data, wherein said generating comprises feedback control using a send-ahead substrate from said lot of substrates processed through said SiGe cavity formation process, wherein said SiGe cavity data includes SiGe-to-gate distance (S2G) data, and wherein said customized time for said selected dry lateral etch for remaining substrates in said lot of substrates are adjusted based on said S2G distance data measured on said send-ahead substrate.

* * * * *